(12) United States Patent  
Masui et al.

(10) Patent No.: US 11,486,562 B2  
(45) Date of Patent: Nov. 1, 2022

(54) CONTROLLING OFF-STATE APPEARANCE OF A LIGHT EMITTING DEVICE

(71) Applicant: LUMILEDS LLC, San Jose, CA (US)

(72) Inventors: Hisashi Masui, San Jose, CA (US); Oleg Shchekin, San Francisco, CA (US); Ken Shimizu, Sunnyvale, CA (US); Marcel Bohmer, Eindhoven (NL); Frank Jin, San Jose, CA (US); Jyoti Bhardwaj, Cupertino, CA (US)

(73) Assignee: Lumileds LLC, San Jose, CA (US)

( * ) Notice: Subject to any disclaimer, the term of this patent is extended or adjusted under 35 U.S.C. 154(b) by 32 days.

(21) Appl. No.: 17/028,926

(22) Filed: Sep. 22, 2020

(65) Prior Publication Data  
US 2021/0013380 A1 Jan. 14, 2021

Related U.S. Application Data

(63) Continuation of application No. 15/747,076, filed as application No. PCT/US2016/039782 on Jun. 28, 2016, now Pat. No. 10,797,206.  
(Continued)

(51) Int. Cl.  
*F21V 9/40* (2018.01)  
*H01L 33/44* (2010.01)  
(Continued)

(52) U.S. Cl.  
CPC ............... *F21V 9/40* (2018.02); *F21K 9/00* (2013.01); *F21K 9/20* (2016.08); *F21V 14/003* (2013.01);  
(Continued)

(58) Field of Classification Search  
CPC ....... H01L 33/502; H01L 33/50; H01L 33/44; H01L 33/641; C09B 67/0097; F21K 9/20;  
(Continued)

(56) References Cited

U.S. PATENT DOCUMENTS 3,601,583 A * 8/1971 Fujiwara .................. H05B 3/86  
219/522  
4,169,661 A * 10/1979 Yamada ................ G02F 1/0147  
359/289  
(Continued)

FOREIGN PATENT DOCUMENTS

CN 102159881 A 8/2011  
CN 102315206 A 1/2012  
(Continued)

OTHER PUBLICATIONS

Kulcar et. al., "Dynamic Colour Possibilities and functional properties of Thermochromic printing inks", Acta Graphica, 23, pp. 25-36 (2012) (Year: 2012).*  
(Continued)

*Primary Examiner* — Phat X Cao  
*Assistant Examiner* — Victor V Barzykin

(57) ABSTRACT

Systems for apparatuses formed of light emitting devices. Solutions for controlling the off-state appearance of lighting system designs is disclosed. Thermochromic materials are selected in accordance with a desired off-state of an LED device. The thermochromic materials are applied to a structure that is in a light path of light emitted by the LED device. In the off-state the LED device produces a desired off-state colored appearance. When the LED device is in the on-state, the thermochromic materials heat up and become more and more transparent. The light emitted from the device in its on-state does not suffer from color shifting due to the presence of the thermochromic materials. Furthermore, light emitted from the LED device in its on-state does not suffer from attenuation due to the presence of the thermochromic materials. Techniques to select and position thermochromic materials in or around LED apparatuses are presented.

20 Claims, 14 Drawing Sheets

Related U.S. Application Data

(60) Provisional application No. 62/196,178, filed on Jul. 23, 2015.

(51) Int. Cl.
   *F21V 14/00* (2018.01)
   *F21K 9/00* (2016.01)
   *F21K 9/20* (2016.01)
   *H05B 45/28* (2020.01)
   *G02B 27/09* (2006.01)
   *H01L 33/50* (2010.01)

(52) U.S. Cl.
   CPC .......... *G02B 27/0955* (2013.01); *H01L 33/44* (2013.01); *H01L 33/502* (2013.01); *H05B 45/28* (2020.01); *H01L 33/50* (2013.01)

(58) Field of Classification Search
   CPC . F21K 9/00; F21V 14/003; F21V 9/40; H05B 37/0209; H05B 33/0857; G02B 27/0955
   See application file for complete search history.

(56) References Cited

U.S. PATENT DOCUMENTS

| | | | | |
|---|---|---|---|---|
| 4,598,035 | A * | 7/1986 | Usami | B41M 5/30 427/212 |
| 8,432,500 | B2 | 4/2013 | Van Bommel et al. | |
| 8,664,156 | B2 * | 3/2014 | Kwan | B41M 5/337 503/201 |
| 8,974,087 | B2 | 3/2015 | Moeck et al. | |
| 2003/0140934 | A1 * | 7/2003 | Sugai | A41G 3/0083 132/53 |
| 2011/0176076 | A1 * | 7/2011 | Van Bommel | F21K 9/68 349/22 |
| 2011/0317398 | A1 | 12/2011 | Moeck et al. | |
| 2013/0172181 | A1 * | 7/2013 | Kwan | C09B 67/0097 503/201 |
| 2013/0172182 | A1 * | 7/2013 | Kwan | B41M 5/30 503/201 |
| 2013/0172183 | A1 * | 7/2013 | Kwan | C09B 67/0008 503/201 |
| 2014/0233214 | A1 * | 8/2014 | Berben | H01L 33/501 362/84 |
| 2017/0313120 | A1 * | 11/2017 | Philippe | B42D 25/41 |

FOREIGN PATENT DOCUMENTS

| | | |
|---|---|---|
| CN | 103875086 A | 6/2014 |
| CN | 102159881 B | 8/2014 |
| DE | 102012205461 A1 | 10/2013 |
| EP | 2331870 A2 | 6/2011 |
| EP | 2848989 A2 | 3/2015 |
| JP | 1992070540 U | 6/1992 |
| JP | 1993066426 A | 3/1993 |
| JP | 2002150812 A | 5/2002 |
| JP | 2013504840 A | 2/2013 |
| KR | 201200297097 A | 3/2012 |
| WO | 2010/035171 A2 | 4/2010 |
| WO | 2016/041838 A1 | 3/2016 |

OTHER PUBLICATIONS

Tyan et. al., "An insight into the solvent effect on photo-, solvatochromism of spiropyran through the perspectives of intermolecular interactions", Dyes and Pigments, 105, pp. 66-74 (Year: 2014).*
Notification from the EPO as ISA, "International Search Report and the Written Opinion", PCT/US2016/039782, dated Sep. 8, 2016, 12 pages.

* cited by examiner

CONTROLLING OFF-STATE APPEARANCE OF A LIGHT EMITTING DEVICE

CROSS REFERENCE TO RELATED APPLICATIONS

The present application is a continuation of U.S. patent application Ser. No. 15/747,076, filed Jan. 23, 2018, which is a U.S. National Stage Entry of International Application No. PCT/US2016/039782, filed Jun. 28, 2016, which claims the benefit of priority to U.S. Provisional Application No. 62/196,178, filed Jul. 23, 2015. Each of the above patent applications is incorporated herein by reference in its entirety.

FIELD OF INVENTION

This disclosure relates to an apparatus formed of light emitting diode (LED) devices, and more particularly to techniques for varying the off-state color of a light emitting apparatus.

BACKGROUND

When in an off-state, light emitting devices such as light emitting diodes (LEDs) show as the color of phosphors that have been applied on the top of the LED chips. The phosphor might serve the purpose of downconverting light, however the color of the phosphor does not necessarily match a designer's desired color, and does not necessarily match the color of the emitted light when the light emitting device is in an on-state. Accordingly, it is often desired to manage the off-state color of the LED for cosmetic reasons. An example is a translucent diffusive layer applied over the LED of, for example, a flash unit in order to provide a white off-state appearance. Further control of the off-state appearance has long been desired so as to be flexible with respect to controlling cosmetic appearances of a finished product.

Typical white LEDs consist of LED chips covered by wavelength converting materials such as phosphors, dyes, or quantum dots. Because of this structure, phosphors are visible when the LED is powered off. Yellow- or orange-looking phosphors are often visible. Further, yellow or orange appearances might be aesthetically in conflict with a designer's intention. For this reason, a white diffusive layer is often applied to the flash units. Such diffusive layers are limited to white light (translucent) to minimize the optical disadvantages such as the emission color being chromatically skewed and/or the emission light intensity being decreased.

Improvements are needed.

SUMMARY

According to certain embodiments of the herein-disclosed techniques for controlling the off-state appearance of a light emitting device, a method and apparatus are used in systems that dispose thermochromic materials of a selected color onto visible portions of the apparatus.

Certain embodiments are directed to technological solutions for disposing thermochromic materials of a selected color onto the apparatus, which embodiments advance the relevant technical fields as well as advancing peripheral technical fields. The herein-disclosed techniques provide technical solutions that address the technical problems attendant to lighting system designers who want to control the off-state appearance of designs without introducing color shifting of the output light and without suffering decreased light output in the on-state.

Some embodiments comprise a structure or derive from a structure comprising a semiconductor light emitting device and thermochromic pigment that is disposed in a path of light emitted by the semiconductor light emitting device. Some variations further comprise disposing a wavelength converting material between the semiconductor light emitting device and the thermochromic pigment.

In some variations the thermochromic pigment is in direct contact with the wavelength converting material.

In some variations the thermochromic pigment is spaced apart from the wavelength converting material, which variations can further comprise a heat generator in direct contact with the thermochromic pigment, and some variations further comprise electrically-conductive wires embedded in the thermochromic pigment and/or disposed on or embedded in a conductive glass.

Some variations further comprise a lens disposed in a path of light emitted by the semiconductor light emitting device, wherein the thermochromic pigment is disposed on the lens. In some variations the thermochromic pigment is disposed in a transparent material.

In example variations, the thermochromic pigment undergoes a phase transition by heating, wherein during the phase transition the thermochromic pigment changes from a colored appearance to a transparent or translucent appearance. The colored appearance is one of blue, or black, or red.

Some embodiments are fabricated by practicing a method for forming a semiconductor light emitting device and for disposing thermochromic pigments in a path of light emitted by the semiconductor light emitting device. Method steps can further comprise heating the thermochromic pigment to a temperature such that the thermochromic pigment undergoes a phase transition. The heating can include positioning the thermochromic pigment such that the thermochromic pigment absorbs heat generated by the semiconductor light emitting device or the heating can include activating a heat generator to heat a thermally-conductive structural member that is in contact with the thermochromic pigment.

Further details of aspects, objectives, and advantages of the technological embodiments are described herein and in the following descriptions, drawings, and claims.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1A:
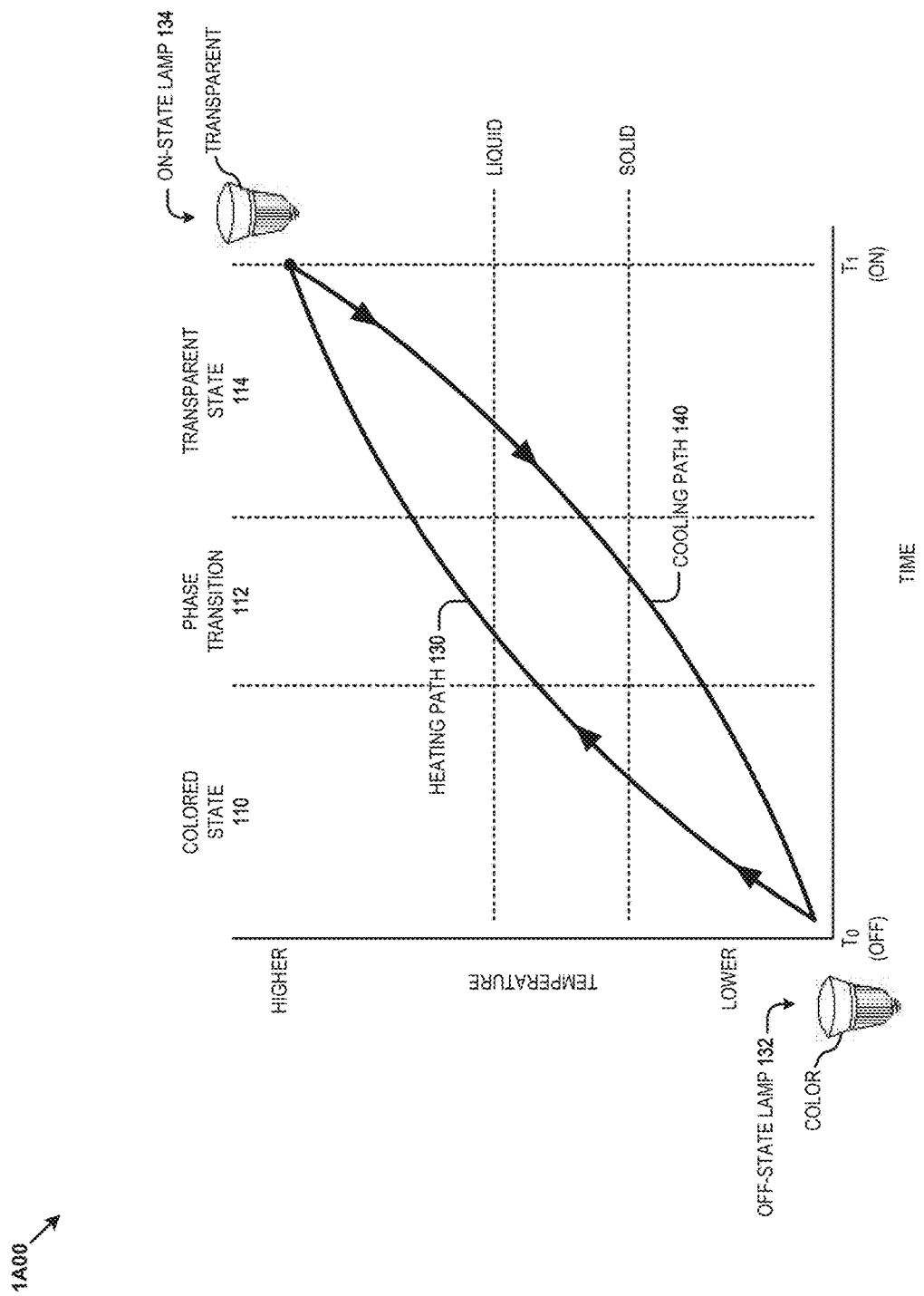
FIG. 1A presents a thermochromic material phase transition chart showing paths for heating and cooling so as to vary the color of a light emitting apparatus between the off-state and the on-state, according to an embodiment.

Some embodiments of the present disclosure address the problem of controlling the off-state appearance of lighting system designs such that color shifting of the output light in the on-state is eliminated or reduced and such that light output in the on-state is not unduly attenuated. Some embodiments are directed to approaches for selecting an off-state color of thermochromic materials, and then controlling thermochromic materials through transitions from an on-state of a lighting system to the off-state of the lighting system and back. The accompanying figures and discussions herein present example structures, devices, systems, and methods.

Overview

In embodiments of the present invention, an LED's off-state appearance may be changed from the typical phosphor-coated appearance. In some embodiments, the off-state appearance is changed without losing any LED functionality, or without losing any substantial LED functionality. By applying heat-sensitive pigments (called thermochromic materials) over the LED, the off-state appearance of the LED is defined by the heat-sensitive pigments (e.g., red, green, blue, etc.) or combinations of pigments (e.g., mixtures that combine to a black color, mixtures of green and blue pigments, etc.). When the LED is powered on, heat generated by the LED apparatus causes a phase transition of the thermochromic materials into a transparent/translucent state such that normal light emission from the LED is achieved. Thermochromic pigments can also be spaced apart from the LED by implementing a separate heat generator to cause the phase transition of the thermochromic pigments, or by designing a structure where the temperature of the pigments is raised to the temperature necessary for the phase transition by absorbing light from the LED.

Various embodiments are described herein with reference to the figures. It should be noted that the figures are not necessarily drawn to scale and that elements of similar structures or functions are sometimes represented by like reference characters throughout the figures. It should also be noted that the figures are only intended to facilitate the description of the disclosed embodiments—they are not representative of an exhaustive treatment of all possible embodiments, and they are not intended to impute any limitation as to the scope of the claims. In addition, an illustrated embodiment need not portray all aspects or advantages of usage in any particular environment. An aspect or an advantage described in conjunction with a particular embodiment is not necessarily limited to that embodiment and can be practiced in any other embodiments even if not so illustrated. References throughout this specification to "some embodiments" or "other embodiments" refer to a particular feature, structure, material or characteristic described in connection with the embodiments as being included in at least one embodiment. Thus, the appearance of the phrases "in some embodiments" or "in other embodiments" in various places throughout this specification are not necessarily referring to the same embodiment or embodiments.

Definitions

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Reference is now made in detail to certain embodiments. The disclosed embodiments are not intended to be limiting of the claims.

Descriptions of Example Embodiments

FIG. 1A presents a thermochromic material phase transition chart 1A00 showing paths for heating and cooling so as to vary the color of a light emitting apparatus between the off-state and the on-state.

The chart shows a heating path 130 that traverses through time and temperatures corresponding to a colored state 110, a phase transition 112, and a transparent state 114. The shown temperatures and temperature ranges are merely examples of certain thermochromic materials that change color and transmittance as a function of temperature. When thermochromic materials are placed in proximity of a light emitting diode (LED), and the proximal light emitting diode is turned on, then the temperature of such materials increases over time (see the abscissa of the chart). An apparatus such as an LED lamp or flash unit can be constructed such that thermochromic materials that are placed in proximity of a heat-generating light emitting diode change phase. One phenomenon of thermochromic materials is to change visual appearance as the materials transition between phases.

Thermochromic materials are often based on either liquid crystals or leuco dyes. Liquid crystals are used in applications where the liquid crystal responses are used within relatively narrow ranges of temperatures.

Regarding liquid crystal responses, color changes result from changes of reflectivity of certain wavelengths by the crystalline structure of the material. As the crystalline structure of the material changes over a temperature range (e.g., between a low-temperature crystalline phase, through an anisotropic chiral or twisted nematic phase, to a high-temperature isotropic liquid phase) so does the apparent color. Light passing through the crystalline structure undergoes Bragg diffraction. Wavelengths with the greatest constructive interference are reflected back, which in turn gives off a colored appearance. Changes in the temperature of the material can result in changes of spacing between the crystalline layers and therefore changes in the reflected wavelengths. The apparent color of a thermochromic liquid crystal can range from non-reflective (e.g., black), through the spectral colors, and into a transparent regime. The color, reflectance, and transparency can vary depending on the temperature.

Regarding leuco dyes, such dyes are often used in applications that demand a wide range of colors to be used and/or when response temperatures need not be precise.

Considering the depiction of FIG. 1A, an LED lamp with thermochromic materials disposed over a bulb portion of a lamp can appear with a color (see off-state lamp 132) when at room temperature (e.g., when the thermochromic material is at or about 26° C.). After a phase transition of the thermochromic materials that are disposed over the bulb portion of the lamp, the bulb becomes transparent when the thermochromic material is at or about 120° C. (see on-state lamp 134).

When power to the LED lamp is turned off, the thermochromic materials begin to cool, following cooling path 140. After a phase transition of the thermochromic materials, the bulb begins to appear with a color.

The on-state can be maintained for any duration (e.g., while power is applied to the LED so as to raise the temperature), and the off-state can be maintained for any duration (e.g., while power to the LED is off so as to allow the temperature to decrease to an ambient temperature). A series of state transitions responsive to transitioning events is shown and described as pertains to FIG. 1B.

Figure 1B:
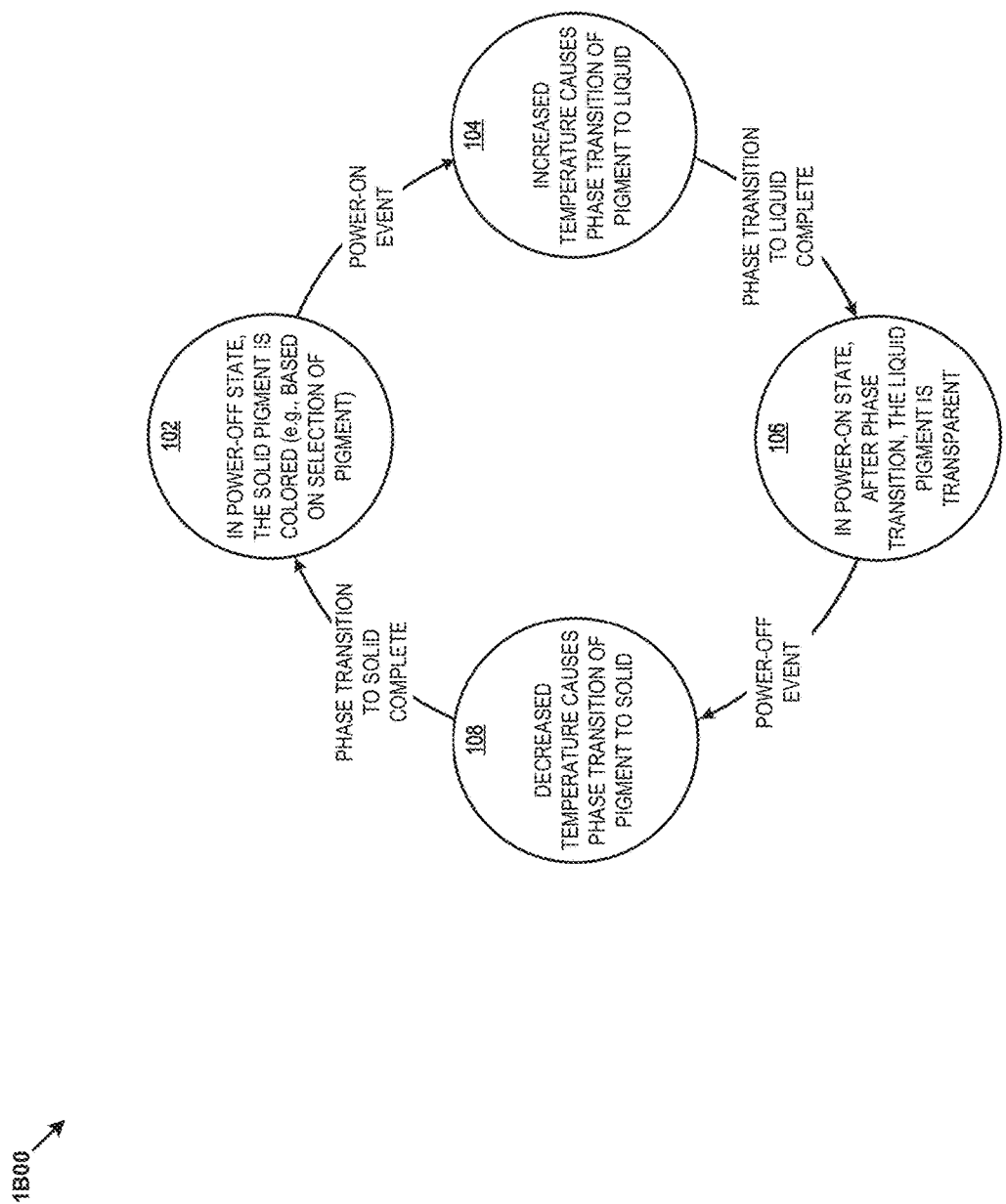
FIG. 1B is a state transition chart showing transitions between heating and cooling so as to vary the color of a light emitting apparatus between the off-state and the on-state, according to some embodiments.

FIG. 1B is a state transition chart 1B00 showing transitions between heating and cooling so as to vary the color of a light emitting apparatus between the off-state and the on-state. The embodiment shown in FIG. 1B is merely one example involving use of a thermochromic-containing colored pigment.

At state 102 (e.g., a power-off state) the solid pigment is colored. The color can be controlled by selection of pigments and other materials (see FIG. 3). After a power-on event, the temperature increases. At state 104, the increased temperature causes a phase transition of the pigment to a liquid state. As is understood by those skilled in the art, there are many possible carriers such that the pigment remains substantially proximal to the LED even after transition to a liquid state. For example, the pigment might be dispensed as a powder, and/or encapsulated in a bead or a capsule, possibly in a dye-developer combination (see FIG. 3).

When the phase transition is complete, and during the time period that the LED is at an elevated temperature, the liquid pigment is in a state 106 that remains transparent to the light emanating from the LED. This state can be maintained while the LED is at an elevated temperature (e.g., due to being powered-on). When there is a power-off event, the decreased temperature causes a phase transition of the pigment back to a solid (see transition state 108). After a phase transition back to a solid is complete, the LED transition to the power off state, state 102, and once again the solid pigment appears as having a color.

The transition from solid to liquid and back from liquid to solid can occur in a relatively short time period. For example, the temperature of the pigment can change sufficiently fast so as to cause a phase change from solid to liquid in a fraction of a second. The following figure depicts a fast phase transition as a function of a time-variant current being applied to a proximal light emitting device.

Figure 1C:
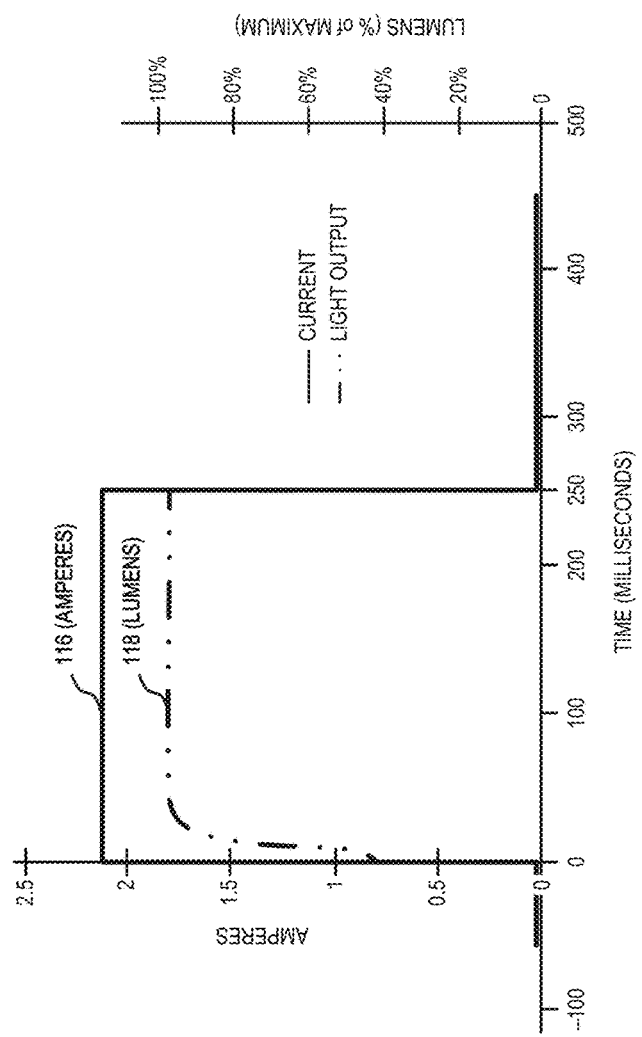
FIG. 1C depicts time-variant behavior of a fast-switching thermochromic material in response to a varying electrical current being applied to a collocated light emitting device, according to some embodiments.

FIG. 1C depicts time-variant behavior of a fast-switching thermochromic material 1C00 in response to a varying electrical current being applied to a collocated light emitting device. In this embodiment three variables change together in an in-phase relationship. Specifically, and as shown, at time T=0, a current 116 (e.g., a 2 ampere current) is applied. The LED begins to generate light output 118 up to a maximum light output (e.g., up to about 100% of maximum light output), and then, after the current goes to zero, the light output also goes to zero. During this time period (e.g., between T=0 ms to T=250 ms) the pigments that are proximal to the light emitting device undergo the aforementioned phase transition to transparent, and then back to the colored state. A camera flash unit can be constructed so as to behave substantially as depicted in FIG. 1C.

Figure 2A:
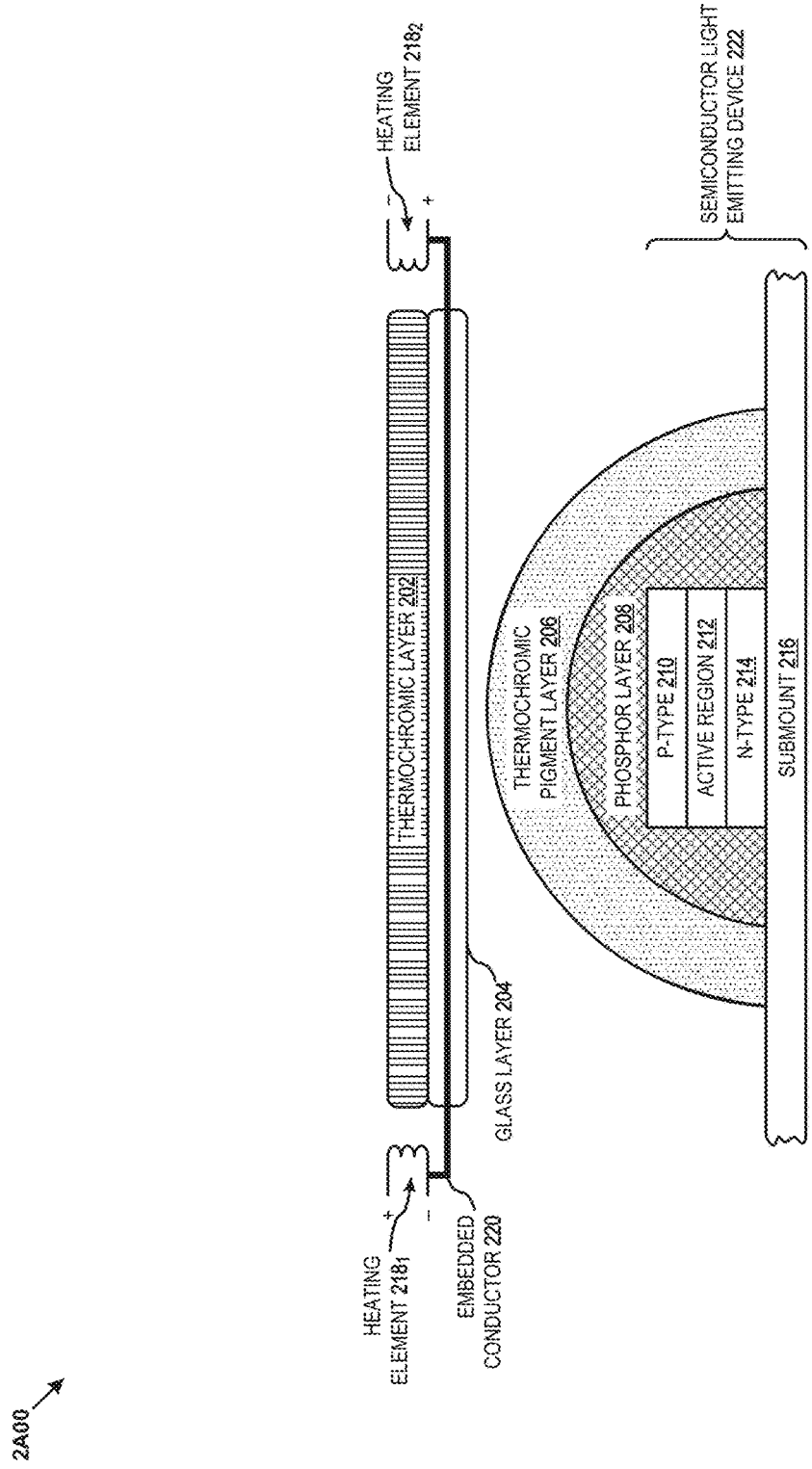
FIG. 2A depicts a semiconductor light emitting apparatus comprising structures that vary the color of a light emitting apparatus between the off-state and the on-state, according to some embodiments.

FIG. 2A depicts a semiconductor light emitting apparatus 2A00 comprising structures that vary the color of a light emitting apparatus between the off-state and the on-state. As an option, one or more variations of semiconductor light emitting apparatus 2A00 or any aspect thereof may be implemented in any environment and/or in any context of the embodiments described herein.

As shown a semiconductor light emitting device 222 is formed using a submount 216, atop of which is grown n-type material 214. An active region 212 might be doped before disposing p-type material 210. Electrical contacts are formed on the n-type and p-type layers. When an electrical potential of sufficient voltage is applied to the contacts (e.g., between the n-type and the p-type material), photons are emitted from the active region. Such photons might be substantially monochromatic (e.g., blue light). Some variations of semiconductor light emitting device 222 might include a phosphor layer 208 so as to convert monochromatic photons into photons of different energies. As such, down-converting, and in some cases up-converting photons can be engineered (e.g., by selection of wavelength-converting materials) so as to produce light that ranges across a wavelength spectrum. The phosphor layer can be disposed proximal to the active region of the semiconductor light emitting device, or it can be disposed remotely, such as on an inside surface of a bulb.

A thermochromic layer 202 provides structure such that an off-state appearance may be controlled so as to be changed into a transparent appearance. Specifically, when the semiconductor light emitting device is powered on, heat generated by the semiconductor light emitting device causes a phase transition of the thermochromic materials disposed in or on the thermochromic layer such that a transparent or translucent appearance is achieved. In this and other embodiments, light emissions are achieved without light output attenuation and without undesired on-state chromatic shifting.

In some embodiments, thermochromic pigments can be disposed so as to be distal from the LED by implementing a separate heat generator (e.g., heating element $218_1$, heating element $218_2$) so as to cause the phase transition of the thermochromic pigments by heating, or by designing a structure where the temperature of the pigment is raised to the temperature necessary for the phase transition by absorbing photons from the LED. In some embodiments, a densified film of thermochromic pigments is used to enhance heat transfer from the LED to all pigment particles. Thermochromic pigments may be applied to a surface of electrically-conductive and/or thermally-conductive glass such as is shown in FIG. 2A as glass layer 204. An embedded conductor 220 can be disposed on or in the glass. Strictly as one example, an indium tin oxide (ITO) glass can serve as a glass layer that is placed in the path of light emitted by an LED. By putting electrical current through the ITO glass, the glass and the applied pigments are heated by ohmic heat. Similarly, thin electrically-conductive wires can be embedded in or near the thermochromic pigment matrix. The thermochromic pigments can be heated by putting current through the wires. The foregoing description of the glass layer is merely one example. Other structural members that conduct heat can be used. In some embodiments, thermochromic pigments are in direct contact with such a structural member. The structural member itself can be formed of a substantially transparent material (e.g., glass) or formed of a substantially translucent material.

In some embodiments of the invention, thermochromic pigments are applied on top of LEDs in a thermochromic pigment layer 206 on top of a phosphor layer 208 that is disposed in an optical path of the LED active region.

Thermochromic pigments are often available in powder forms and in different colors. In many cases, thermochromic pigments of various colors are selectable based on specific phase transition temperatures.

Figure 2B:
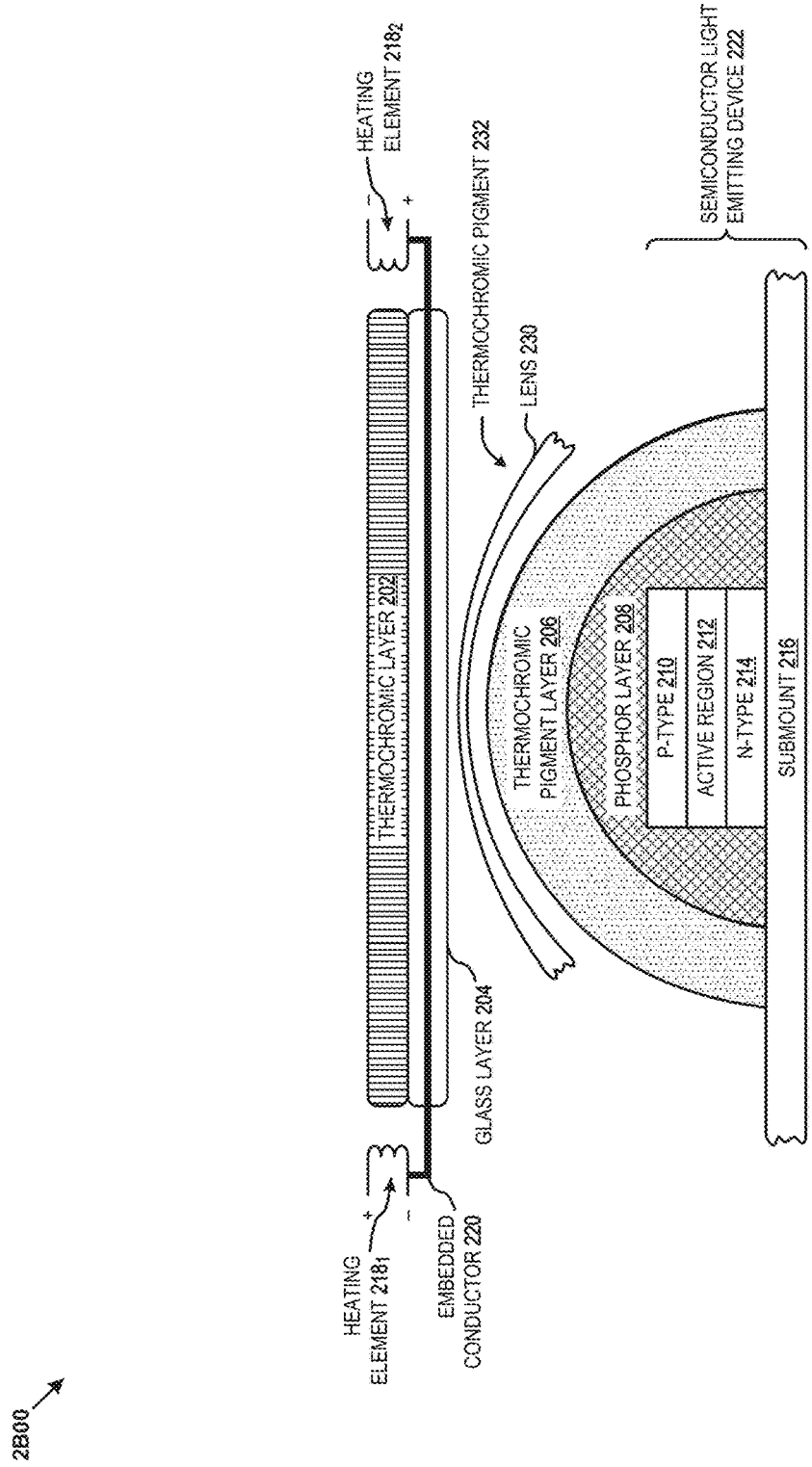
FIG. 2B depicts a semiconductor light emitting apparatus having thermochromic materials disposed on a lens so as to vary the color of a light emitting apparatus between the off-state and the on-state, according to some embodiments.

FIG. 2B depicts a semiconductor light emitting apparatus 2B00 having thermochromic materials disposed on a lens so as to vary the color of a light emitting apparatus between the off-state and the on-state. As an option, one or more variations of semiconductor light emitting apparatus 2B00 or any aspect thereof may be implemented in any environment and/or in any context of the embodiments described herein.

There are many possible ways of disposing the thermochromic pigments in the optical path of the LEDs such that the thermochromic pigments are heated during operation of the LED or heating element. Thermochromic pigments 232 can be applied on a secondary optic such as, for example, a lens 230. The thermochromic pigments applied to the lens absorb light emitted by the LED when the LED is powered on. The absorption of photons from the LED raises the temperature of the lens as well as the thermochromic material, which raised temperature serves to push the thermochromic material through a phase change which in turn exhibits transparency or translucence.

In any of the foregoing embodiments, heating the thermochromic pigment to raise the temperature can include any combinations of heating by operation of the LED, and/or by activating a heat generator that is thermally coupled to the thermochromic pigment (e.g., by proximity, or due to presence of the thermochromic pigment in or on a thermally-conductive structural member).

A device such as is depicted in the foregoing FIG. 2A and FIG. 2B is suitable for a camera flash unit application. In such an application, the flash duration is about 200 ms. One possible design relies only on the photons emanating from the LED to activate the phase change of the thermochromic material. Thus the switching time (e.g., the time needed for a phase change of the thermochromic material) should be sufficiently fast to transform the thermochromic materials to the transparent state in an early portion of the flash cycle. Such a design requirement can be met by mixing a selected thermochromic pigment to form a carrier slurry (e.g., a silicone-based mixture) and depositing the carrier slurry on (or in proximity to) a phosphor layer of an LED. In one embodiment, a black pigment (e.g., a black pigment with a switching temperature of 62° C.) is selected. In the same or other embodiments, other materials such as a blue pigment (e.g., a blue pigment with a switching temperature at 47° C.) can be used, and possibly mixed together with other pigments.

A given application many include a variety of design requirements that can influence selection of a pigment. Strictly as an example, a selection chart can be used so as to facilitate choices when mixing colored and black pigments.

Figure 3:
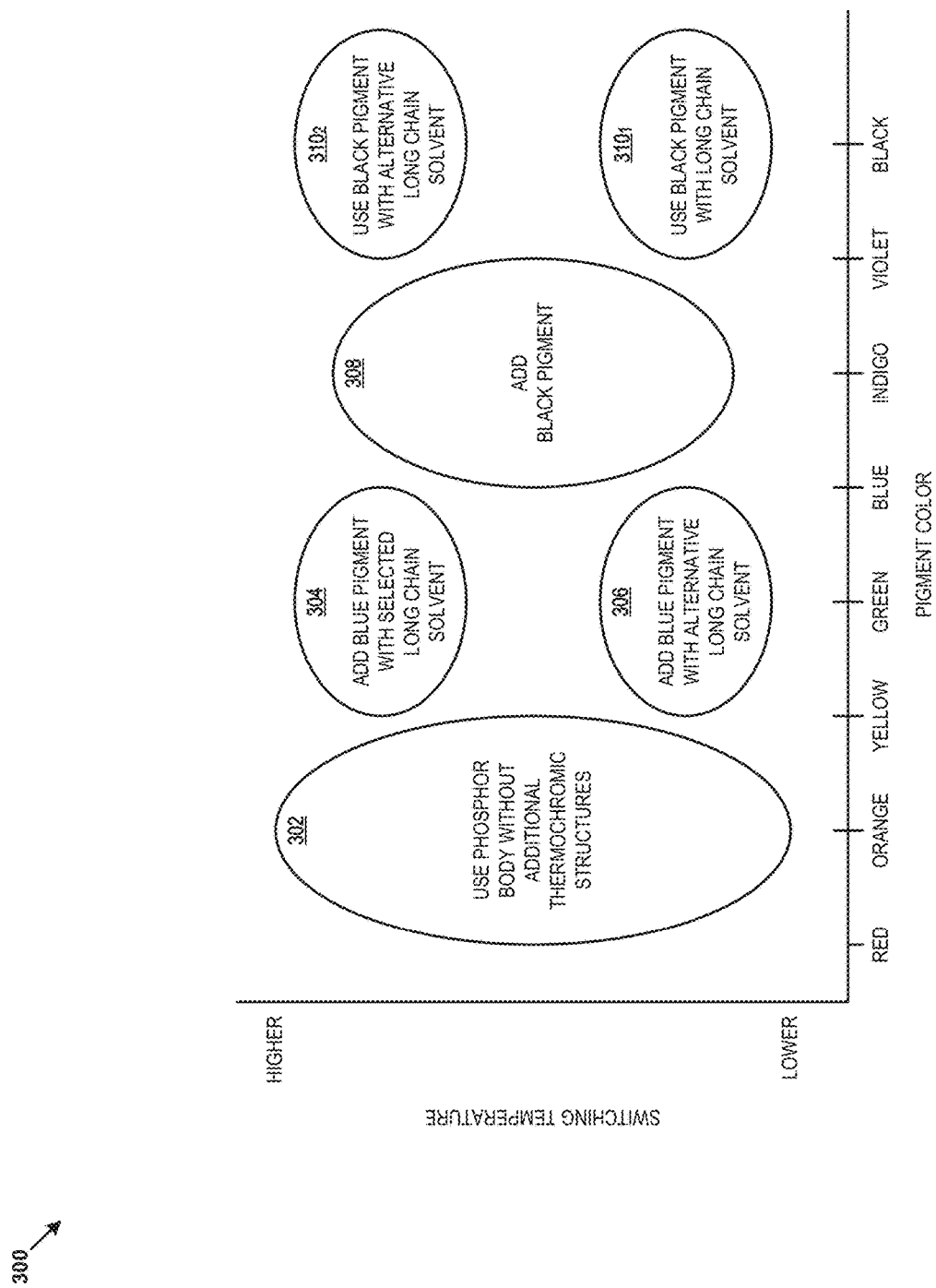
FIG. 3 is a selection chart for selecting wavelength-converting and/or thermochromic materials for varying the off-state color of a light emitting apparatus, according to some embodiments.

FIG. 3 is a selection chart 300 for selecting wavelength-converting and/or thermochromic materials for varying the off-state color of a light emitting apparatus. The chart of FIG. 3 plots ranges of choices depicted as ovals. The ovals are arranged to approximate ranges of switching temperatures (e.g., lower temperatures, higher temperatures) against a spectrum of colors from red, to orange, to yellow, to green, to blue, to indigo, and through to violet. Black is also depicted. Yellow, orange and red fall into a class 302 where the body of the phosphor itself can be used to achieve a desired color appearance. Photons emanating from the LED interact with the phosphors of class 302, which interactions produce a designed-in chromatic shift.

The chart also depicts class 304 and class 306, where green and/or blue thermochromic pigments are mixed with phosphors of red, orange or yellow phosphors so as to produce a desired hue, intensity, and tint, possibly to match to a reference color (e.g., for aesthetic purposes). Blue and black thermochromic pigments exhibit similar switching time characteristics. The class 308 depicts a choice of adding blue or black pigments to mix with other pigments and phosphors offers a wide range of color choices that can be applied to an LED apparatus so as to exhibit a wide range of colored off-state appearances.

The chart depicts switching temperatures from relatively lower temperatures to relatively higher. The shown class $310_1$ depicts relatively lower switching temperatures while class $310_2$ depicts relatively higher switching temperatures.

ThermoChromic Capsules

Thermochromic pigments are often delivered as capsules that comprise a dye, (e.g., a spirolactone, a spiropyran or a fluorane) that forms a colored complex with a developer (e.g., a phenolic-compound such as bisphenol-A). The dye and the developer are both present within sealed polymeric capsules that are filled with a long chain alcohol, ester or acid. The melting point of the alcohol, ester or acid determine the switching temperature of the dye. Upon melting, the dye-developer complex dissociates, thus leading to discoloration of the material. Melamine or other polymers that are hard and relatively temperature stable polymers are often used for the polymeric shell.

As earlier mentioned, it is desired that the thermochromic materials exhibit a high degree of reflectivity (e.g., of the sought-after color) when in the solid state, and a high degree of transparency when in the liquid state. The following FIG. 4 presents scenarios where the thermochromic materials exhibit varying degrees of reflectivity over a range of visible light wavelengths.

Figure 4:
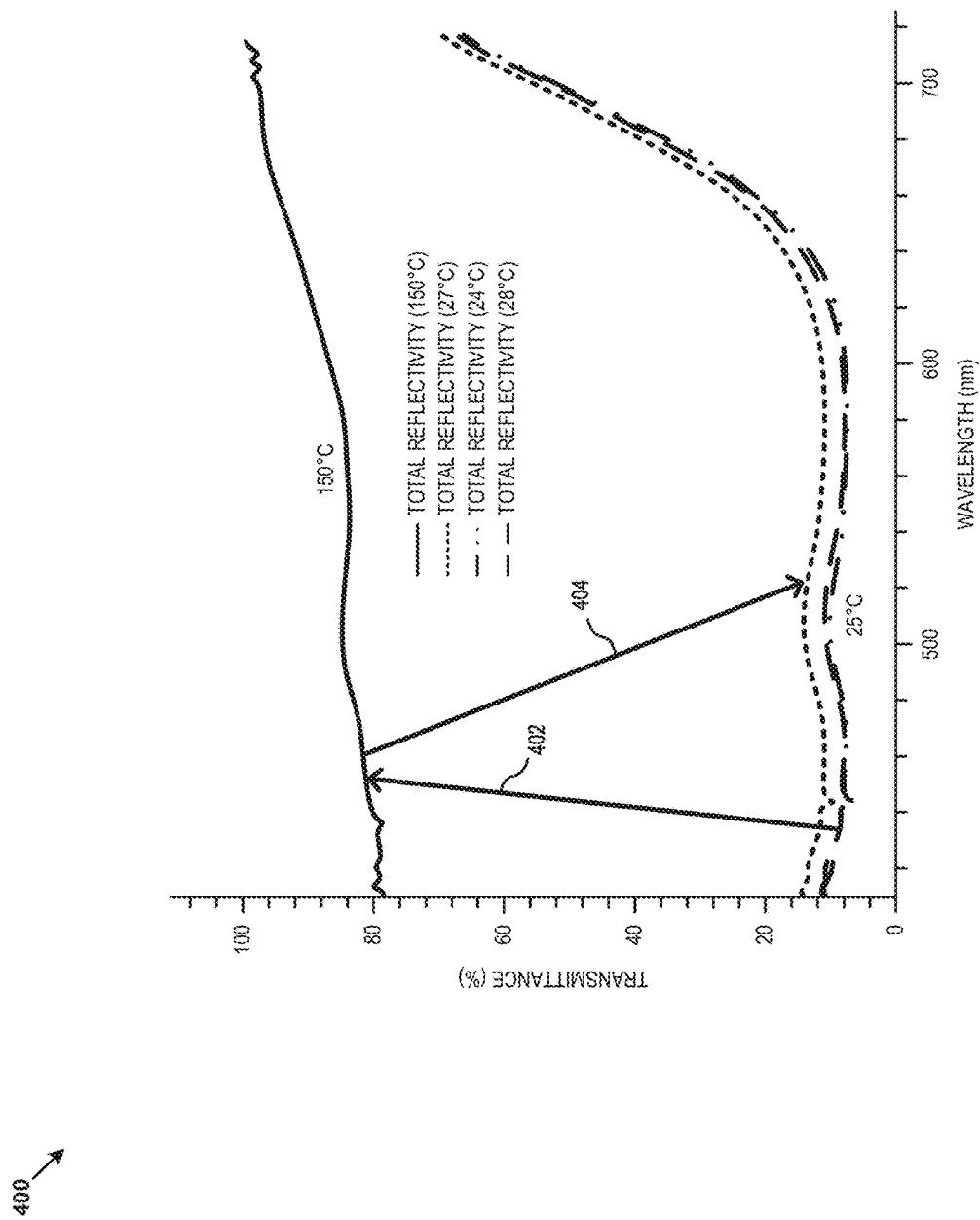
FIG. 4 is a transmission spectra chart showing transmittance of a thermochromic film at two temperatures, according to some embodiments.

FIG. 4 is a transmission spectra chart 400 showing transmittance of a thermochromic film at two temperatures. More specifically, the transmission spectra chart 400 depicts an example series of transmissivity changes of a thermochromic pigment as the temperature is varied between room temperature (e.g., 25° C.) and elevated temperatures (e.g., 150° C.). The change in appearance can be readily detected by the naked eye or under a microscope and without using other detection methods.

In this example, the general shape of the curves demonstrates that the variation in transmittance between the two temperatures is greater at relatively lower wavelengths (e.g., in the blue-green regime). At higher wavelengths (e.g., in the orange-red regime) the thermochromic pigment exhibits higher and higher transparency.

The shown heating transition 402 starts at a low point in the spectrum and then goes through a temperature change up to 150° C. In a cooling transition 404 the material returns an earlier temperature and earlier state (e.g., the dashed line). The shown transitions are merely example transitions.

Figure 5A:
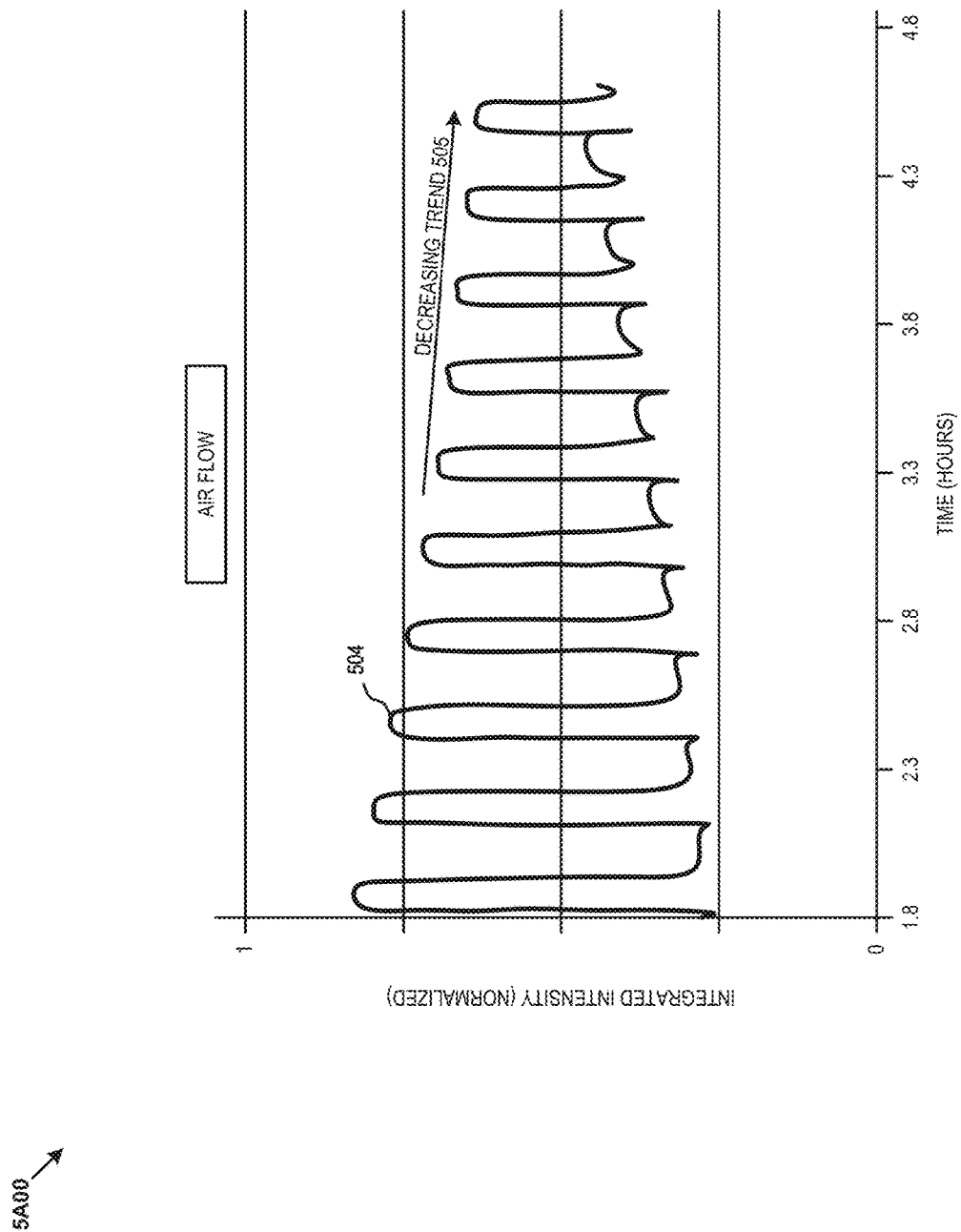
FIG. 5A depicts time-variant performance degradation of a light emitting device in an air-filled environment, according to some embodiments.

FIG. 5A depicts time-variant performance degradation 5A00 of a light emitting device in an air-filled environment. Thermochromic pigments are known to degrade. The degradation can result and/or be advanced by undesirable thermal conditions and/or by undesirable photochemical environments.

Photochemical Degradation

Photochemical degradation most often involves reactive oxygen species such as singlet oxygen and/or radicals originating from peroxides. Remediation techniques (e.g., techniques to inhibit oxygen-related degradation) include introducing antioxidants and radical scavengers such as hindered amine light stabilizers (HALS). Another way to inhibit photochemical degradation is to exclude oxygen from the system by the application of hermetic sealing layers on the layer or layers comprising the thermochromic capsules or on the thermochromic capsules themselves. Thin layer deposition offers a technique to protect an underlying layer or material from coming in contact with oxygen-containing gasses (e.g., air) and/or oxygen-containing liquids (e.g., water).

Further details regarding general approaches to thin layer deposition are described in co-owned patent application publication WO2016041838.

Different applications admit of different degradation remediation techniques. Strictly as an example application, a flash unit (e.g., for a camera) is hereunder discussed. Specific usage patterns and reliability requirements include:
- A minimum of 30,000 flash cycles where the light is turned on for about 200 ms operating under a 1 amperes drive current.
- The temperature reaches 120° C. or more during each flash cycle.
- Operating life is at least 168 hours of high temperature operating life.

To achieve such stringent reliability requirements, contact between the thermochromic materials and oxygen is to be avoided Degradation Remediation Through Exclusion of Oxygen To demonstrate the effect of the exclusion of oxygen on degradation, switching in an air atmosphere (e.g., in a relatively oxygen-rich atmosphere) is compared to switching in a nitrogen atmosphere (e.g., relatively oxygen-poor atmosphere).

When the flash unit system is exposed to blue light in an air-filled environment, the transmitted intensity at high temperature decreases over time (see decreasing trend 505). The damped shape of the curve 504 indicates incomplete switching between phases and/or or browning effects. In the specific example of FIG. 5A, the curve 504 depicts detected blue light intensity when switching from 20° C. (at a low integrated intensity) to 70° C. (at a high integrated intensity) at 0.8 W/cm$^2$ blue light intensity in an air-filled environment (e.g., roughly 25% oxygen).

Degradation of the thermochromic material can be stopped or slowed by eliminating oxygen from the environment in which the thermochromic material is disposed. One technique to eliminate oxygen is to provide a nitrogen-rich atmosphere so as to purge oxygen. Evidence of reduced performance degradation is shown and discussed as pertains to FIG. 5B.

Figure 5B:
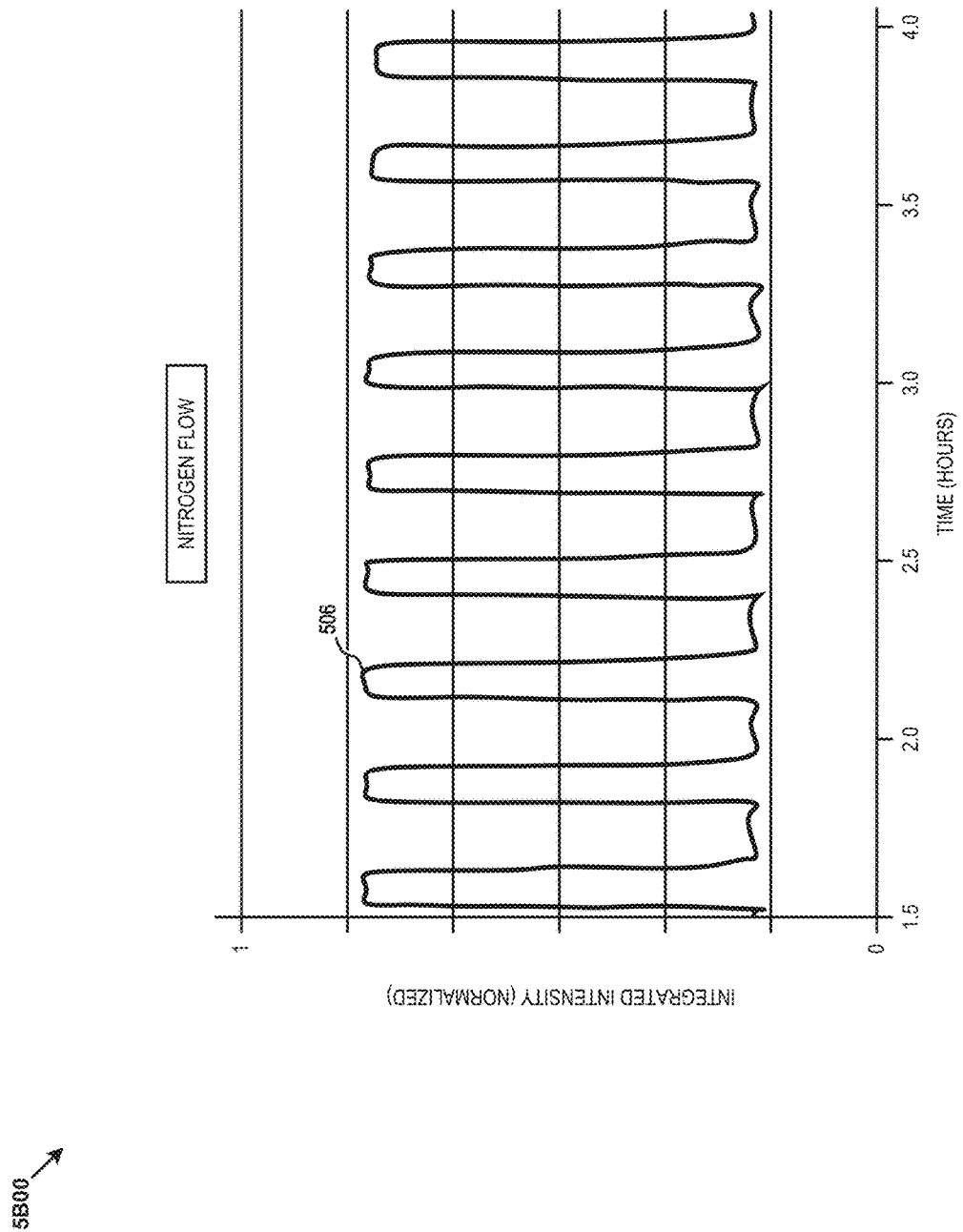
FIG. 5B depicts reduced performance degradation of a light emitting device in an oxygen-depleted environment, according to some embodiments.

FIG. 5B depicts reduced performance degradation 5B00 of a light emitting device in an oxygen-depleted environment. Specifically, the chart depicts the same switching profile as shown and discussed as pertaining to FIG. 5A, however the conditions of FIG. 5B include a nitrogen flow. The light intensity is 0.8 W/cm2, which is the same or similar to the conditions depicted in FIG. 5A. The test conditions include a cycle between a period of 45 minutes in the transparent state and a period of 80 minutes in the colored state. The measurements taken over those periods (see curve 506) are not damped or declining. In an oxygen-poor environment, the device does not undergo appreciable degradation.

Figure 6:
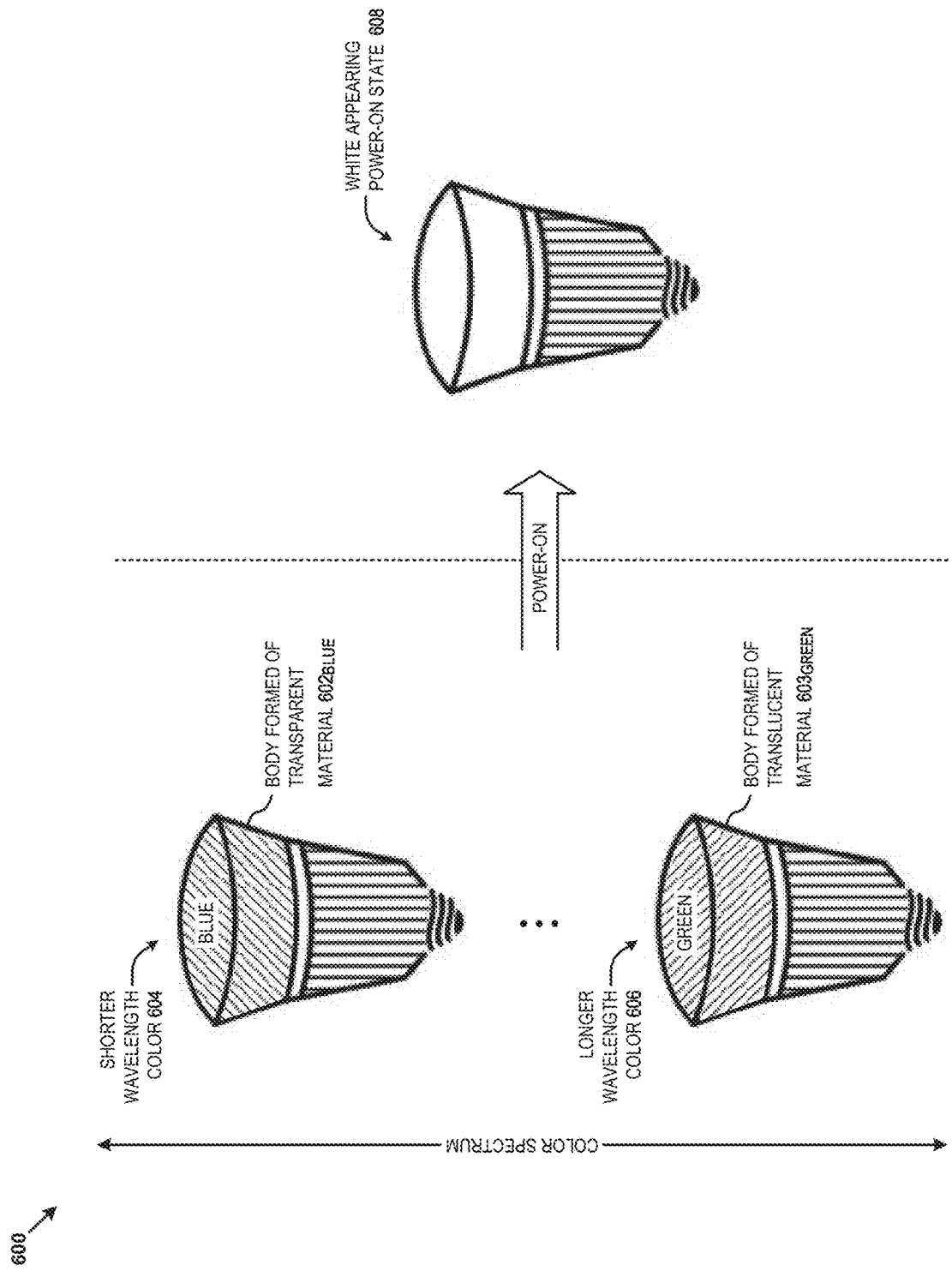
FIG. 6 depicts color-to-white transitions of an A-lamp apparatus between the off-state and the on-state, according to some embodiments.

FIG. 6 depicts color-to-white 600 transitions of an A-lamp apparatus between the off-state and the on-state. As an option, one or more variations of color-to-white 600 or any aspect thereof may be implemented in any environment and/or in any context of the embodiments described herein.

The figure depicts two lamps that are plotted at ends of a blue-green color spectrum. One lamp exhibits a relatively longer wavelength color 606 due to a green-appearing coating of thermochromic material being applied to a body formed of a translucent material $603_{GREEN}$. Another lamp exhibits a relatively shorter wavelength color 604 due to a blue-appearing coating of thermochromic material being applied to a body formed of a translucent material $602_{BLUE}$. When a lamp is powered on, photons from the LED strike the coating, causing a phase change of the coating, which in turn causes a color and/or transmittance change. As shown, the powered-on lamp has a clear or white appearing power-on state 608, which may or may not be visible to the naked eye depending on the intensity of the emanated light.

Applications other than illumination lamps and camera flash units can avail of the herein-disclosed techniques. Strictly as additional examples, thermochromic materials can be used in filament LED lamps and/or hand-held or head-mounted flashlights and/or automotive LED headlamps and/or any applications where the LED module (specifically a coating on a portion of the LED module) is visible to the consumer.

Figure 7:
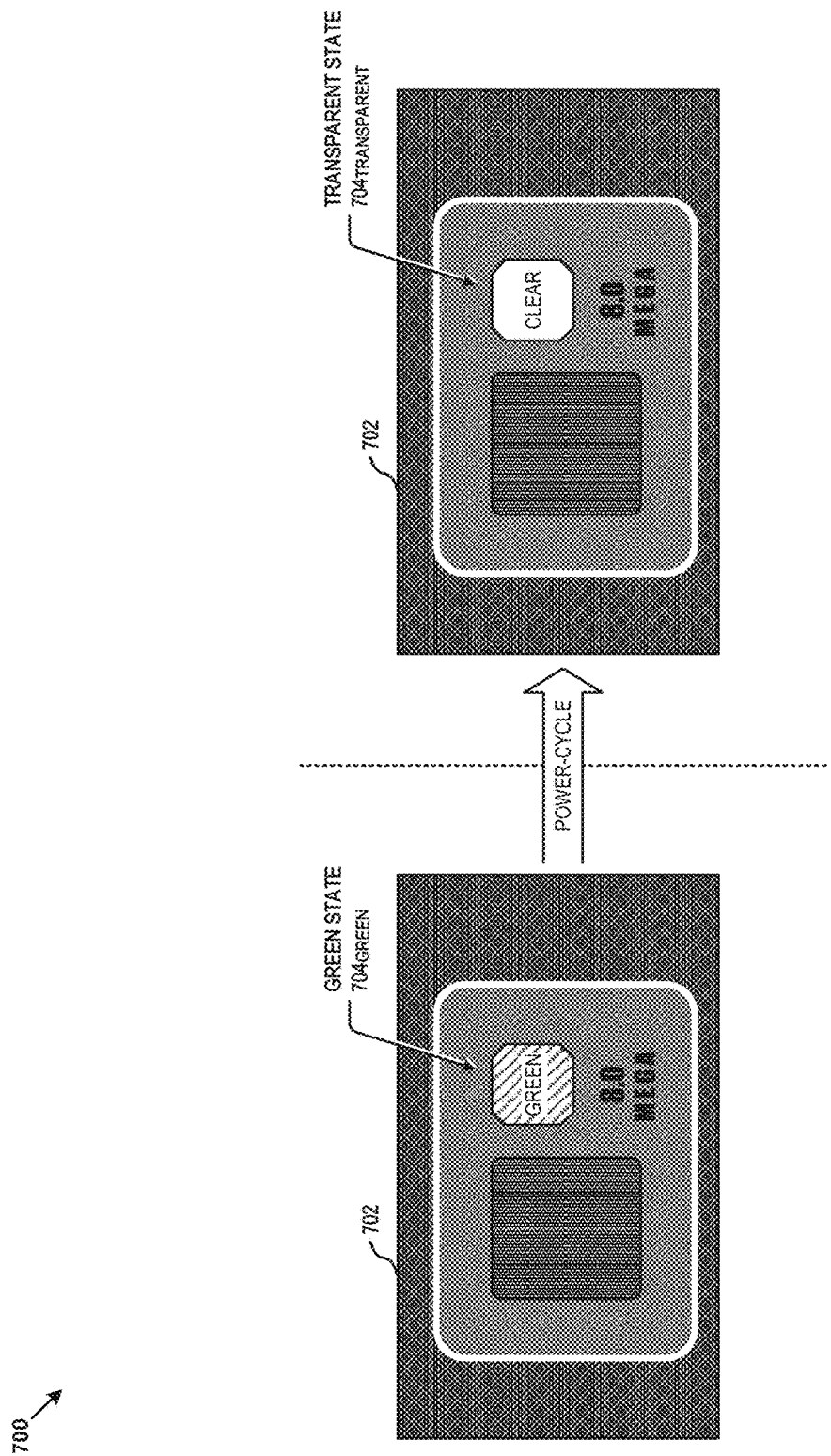
FIG. 7 depicts a color-to-transparent transition of a flash unit apparatus from the off-state to the on-state, according to some embodiments.

FIG. 7 depicts a color-to-transparent 700 transition of a flash unit apparatus from the off-state to the on-state. As an option, one or more variations of color-to-transparent 700 or any aspect thereof may be implemented in any environment and/or in any context of the embodiments described herein.

As shown, a flash unit apparatus is integrated into a device 702 such as a smartphone or camera. In an off-state the flash unit apparatus has a green appearance (see green state $704_{GREEN}$). During a power-cycle to an on-state, the thermochromic materials in or on the visible structures of the flash unit apparatus transition to a clear state (see transparent state $704_{TRANSPARENT}$). As such, the light emanated from the flash unit apparatus is not attenuated, and is not color shifted.

ADDITIONAL EMBODIMENTS OF THE DISCLOSURE

Additional Practical Application Examples

Figure 8A:
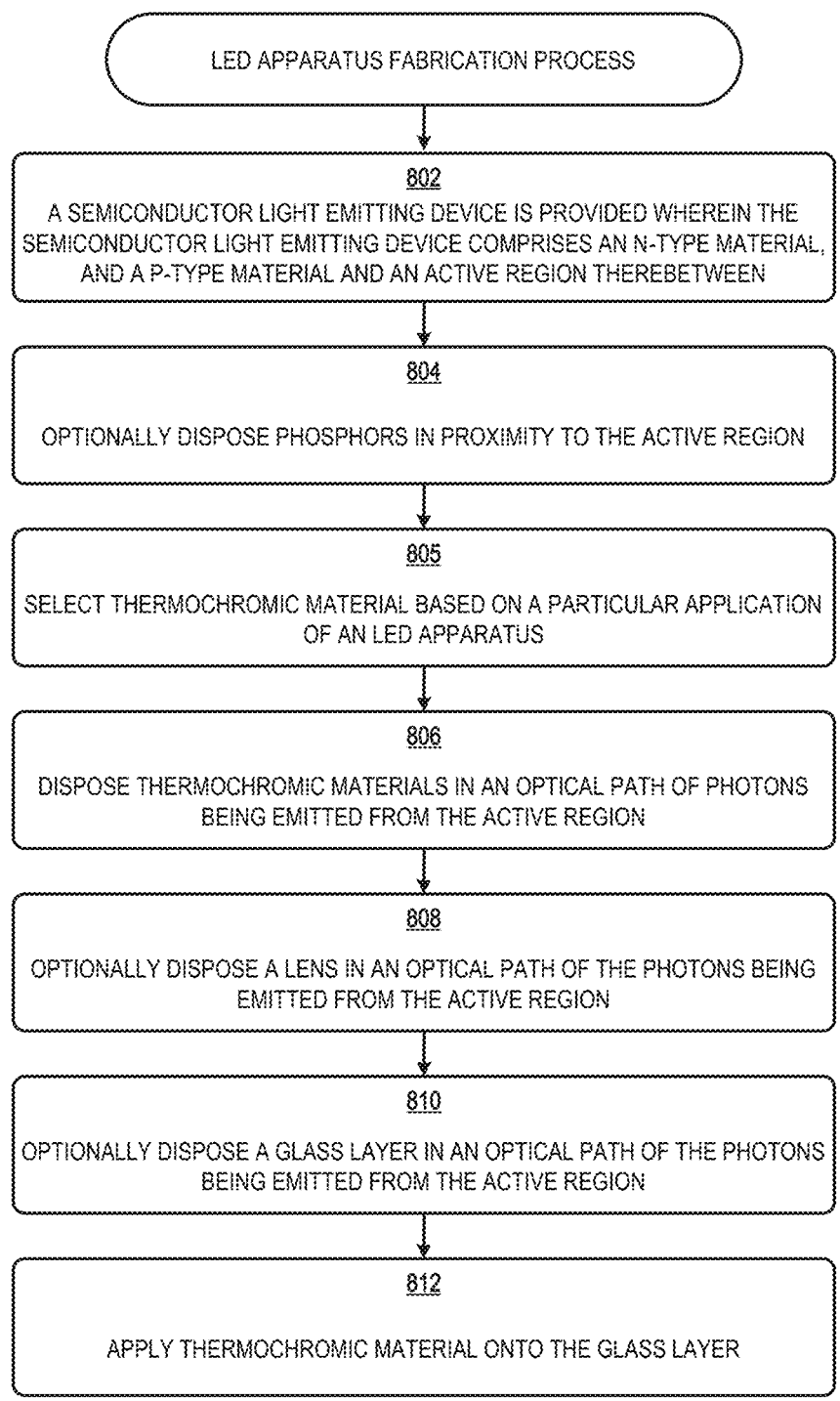
FIG. 8A and FIG. 8B depict methods for fabricating an apparatus in accordance with some embodiments.

FIG. 8A depicts a method 8A00 for fabricating an apparatus in accordance with the disclosure. As shown, a semiconductor light emitting device is provided (step 802). Wavelength-converting materials (phosphors, dyes, or quantum dots) are disposed proximal to the semiconductor light emitting device (step 804). Based on a particular use or application for the semiconductor light emitting device, and/or based on the intended use of the semiconductor light emitting device, one or more thermochromic materials are selected (step 805). The selected one or more thermochromic materials are disposed (e.g., applied, embedded, infused, painted, adhered, loaded, etc.) with a carrier (e.g., a lens, a bulb body, a glass layer, etc.) such that the thermochromic materials are visible in an off-state of the semiconductor light emitting device (step 806). The thermochromic materials can be heated by operation of being in an optical path of the photons emanated from the active region, or can be heated through a heating element. In some embodiments, a lens is placed in an optical path of photons emanating from the active region (step 808). A glass layer can be substantially flat or a glass layer can be shaped so as to serve as a lens, or a glass layer can serve as a bulb (step 810). Such a layer (e.g., glass or other material) that is in an optical path of photons emanating from the active region can serve as a carrier for thermochromic materials (step 812).

Figure 8B:
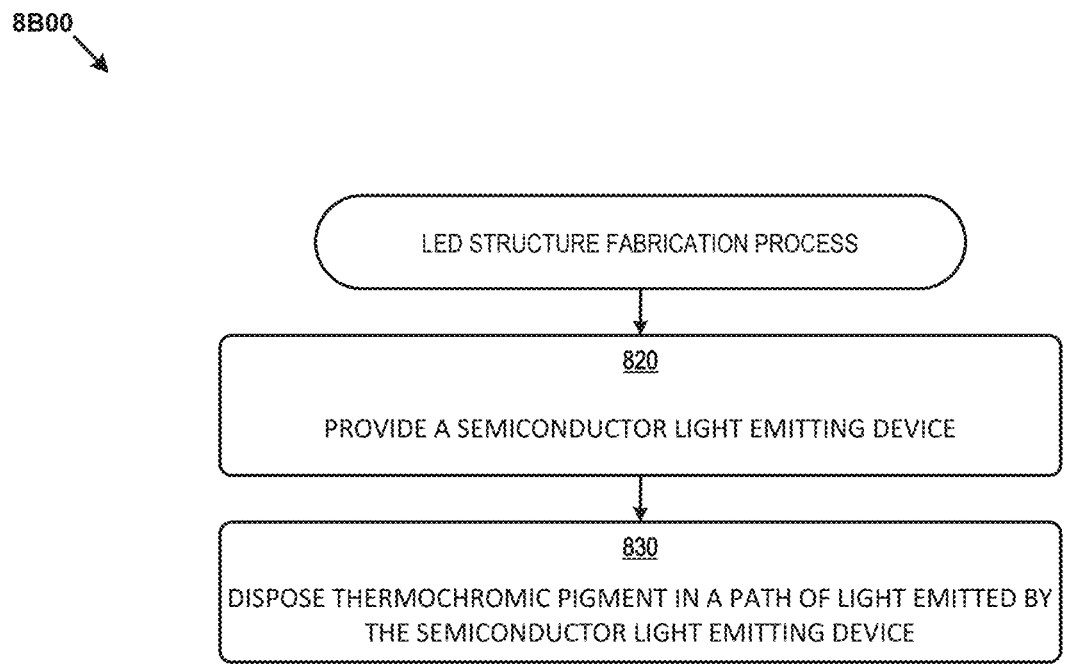

FIG. 8B depicts a method 8B00 for fabricating a structure in accordance with the disclosure. As shown, a structure is assembled by providing a semiconductor light emitting device (step 820) and disposing thermochromic pigment in a path of light emitted by the semiconductor light emitting device (step 830).

ADDITIONAL SYSTEMS EMPLOYING EMBODIMENTS OF THE DISCLOSURE

Additional Examples

Any of the disclosed embodiments or variations thereof can be used in a wide range of lighting applications and/or installation. What follows is a depiction and discussion of some example lighting applications in representative installations.

Figure 9A:
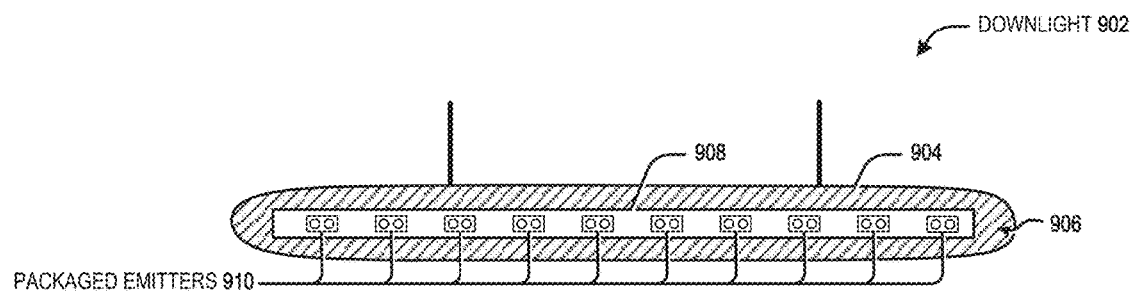
FIG. 9A, FIG. 9B and FIG. 9C depict luminaries suitable for use in various configurations of the embodiments of the present disclosure, and/or for use in the herein-described environments.

FIG. 9A presents a side view of a downlight installation. As shown, the downlight installation 902 includes a rigid or semi-rigid housing 904 that supports a light emitting device array 906. The array of light emitting devices can be organized into any arrangement, for example and as shown, into a linear array that is disposed in within the boundary of a printed wiring board module 908. Some downlights might be composed of more (or fewer) instances of downlight emitters 910 in the light emitting device array.

Figure 9B:
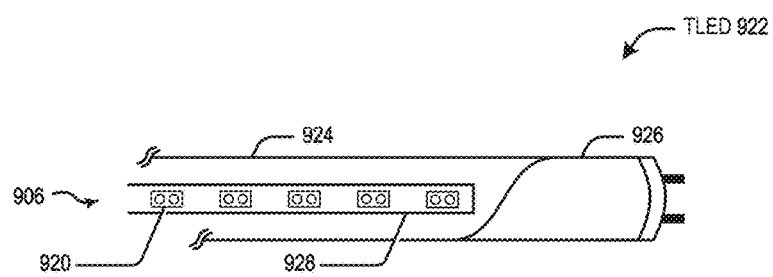

FIG. 9B presents a side view of a tube light emitting diode (TLED) installation. As shown, a TLED 922 includes a linear array of instances of TLED emitters 920 that are organized so as to fit within the TLED cavity formed by the TLED tube boundary 924. A rigid or semi-rigid housing 926 supports a rigid or flexible substrate 928 that supports a light emitting device array 906. The rigid or flexible substrate 928 can include printed wiring structures (e.g., traces, thru-holes, connectors, etc.) or other electrically conductive structures disposed on one or both sides of the rigid or flexible substrate.

Figure 9C:
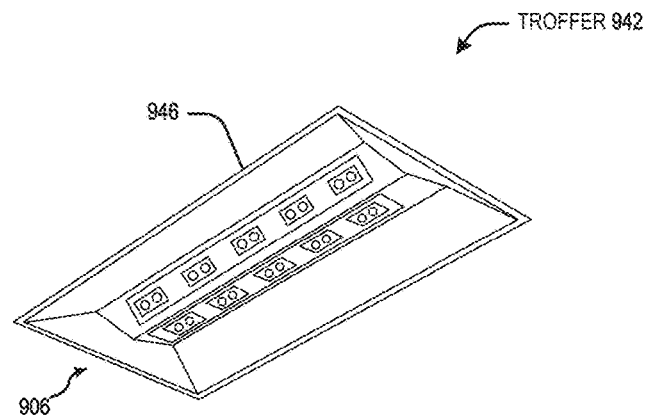

FIG. 9C presents an elevation view of a troffer installation. As shown, the troffer installation 942 includes a rigid or semi-rigid shaped housing 946 that supports an array of light emitting devices. The array of light emitting devices can be organized into any arrangement, for example and as shown, into an arrangement onto a printed wiring board module 908 that is disposed within the boundary of the shaped housing. Some troffers might be composed of more (or fewer) instances of light emitting devices being populated onto the printed wiring board module.

What has been described are approaches for using thermochromic materials of a selected color in LED-based illumination products together with their pertinent advantages.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A structure comprising:
a semiconductor light emitting device;
a phosphor layer disposed on the semiconductor light emitting device; and
a thermochromic layer disposed on the phosphor layer, the thermochromic layer comprising capsules and an antioxidant, the capsules containing a leuco dye and a developer, the leuco dye and the developer forming a complex configured to dissociate upon the application of heat to the thermochromic layer,
the thermochromic layer configured to be transparent or translucent when the leuco dye and the developer are dissociated and configured to have a colored appearance when the leuco dye is complexed with the developer.

2. The structure of claim 1, wherein the colored appearance is a blue appearance, a black appearance, or a red appearance.

3. The structure of claim 1, wherein a transition time between when the thermochromic layer has a colored appearance and when the thermochromic layer is transparent or translucent is 250 milliseconds or less.

4. The structure of claim 1, wherein the leuco dye is a spirolactone, a spiropyran, or a fluorane.

5. The structure of claim 1, wherein the developer is a phenolic compound.

6. The structure of claim 5, wherein the phenolic compound is bisphenol-A.

7. The structure of claim 1, wherein the capsules comprise a long chain alcohol, a long chain ester, or a long chain acid.

8. The structure of claim 7, wherein a melt point of the long chain alcohol, the long chain ester or the long chain acid determines the temperature at which the leuco dye dissociates from the developer.

9. An apparatus comprising:
a camera; and
a camera flash unit comprising:
   a semiconductor light emitting device;
   a phosphor layer disposed on the semiconductor light emitting device; and
   a thermochromic layer disposed on the phosphor layer, the thermochromic layer comprising capsules and an antioxidant, the capsules comprising a leuco dye and a developer, the leuco dye and the developer forming a complex configured to dissociate upon the application of heat to the thermochromic layer, the thermochromic layer having a colored appearance when the leuco dye is complexed with the developer and configured to be transparent or translucent when the leuco dye is dissociated with the developer.

10. A structure comprising:
a semiconductor light emitting device;
a phosphor layer disposed on the semiconductor light emitting device;
a thermochromic layer disposed on the phosphor layer, the thermochromic layer comprising capsules containing a leuco dye and a developer, the leuco dye and the developer forming a complex configured to dissociate upon the application of heat to the thermochromic layer, the thermochromic layer configured to be transparent or translucent when the leuco dye and the developer are dissociated and configured to have a colored appearance when the leuco dye is complexed with the developer; and
hermetic sealing layers on the thermochromic layer or on the capsules or on both.

11. The structure of claim 10, wherein the colored appearance is a blue appearance, a black appearance, or a red appearance.

12. The structure of claim 10, wherein a transition time between when the thermochromic layer has a colored appearance and when the thermochromic layer is transparent or translucent is 250 milliseconds or less.

13. The structure of claim 10, wherein the leuco dye is a spirolacetone, a spiropyran, or a fluorane.

14. The structure of claim 10, wherein the developer is a phenolic compound.

15. The structure of claim 10, wherein the capsules comprise a long chain alcohol, a long chain ester, or a long chain acid.

16. The structure of claim 10, wherein the hermetic sealing layers is on the thermochromic layer.

17. The structure of claim 10, wherein the hermetic sealing layers is on the capsules.

18. An apparatus comprising:
a camera; and
a camera flash unit comprising the structure of claim 10.

19. A lamp comprising the structure of claim 10.

20. The structure of claim 10, wherein the thermochromic layer comprises an antioxidant.

* * * * *